United States Patent [19]
Glenn

[11] Patent Number: 6,150,193
[45] Date of Patent: Nov. 21, 2000

[54] RF SHIELDED DEVICE

[75] Inventor: Thomas P. Glenn, Gilbert, Ariz.

[73] Assignee: Amkor Technology, Inc., Chandler, Ariz.

[21] Appl. No.: 09/083,524

[22] Filed: May 22, 1998

Related U.S. Application Data

[63] Continuation-in-part of application No. 08/741,797, Oct. 31, 1996, Pat. No. 5,981,314.

[51] Int. Cl.[7] .................................................. H01L 21/44
[52] U.S. Cl. ............................ 438/113; 438/33; 438/112; 438/124; 438/126; 438/127
[58] Field of Search ................................... 438/112, 123, 438/124, 126, 127, 613; 257/691, 693, 700, 784, 787, 778, 789, 790, 795; 361/760

[56] References Cited

U.S. PATENT DOCUMENTS

| | | | |
|---|---|---|---|
| 4,508,758 | 4/1985 | Wong ........................................ | 427/96 |
| 4,530,152 | 7/1985 | Roche et al. .............................. | 29/588 |
| 4,768,081 | 8/1988 | Moeller .................................... | 257/682 |
| 4,890,383 | 1/1990 | Lumbard et al. ......................... | 438/27 |
| 5,087,961 | 2/1992 | Long et al. ............................... | 257/701 |
| 5,102,829 | 4/1992 | Cohn ........................................ | 438/118 |
| 5,126,818 | 6/1992 | Takami et al. ........................... | 257/701 |
| 5,153,379 | 10/1992 | Guzuk et al. ........................... | 174/35 R |
| 5,173,766 | 12/1992 | Long et al. ............................... | 257/687 |
| 5,216,278 | 6/1993 | Lin et al. ................................. | 257/688 |
| 5,227,663 | 7/1993 | Patil et al. ............................... | 257/718 |
| 5,239,198 | 8/1993 | Lin et al. ................................. | 257/693 |
| 5,241,133 | 8/1993 | Mullen, III et al. .................... | 174/52.4 |
| 5,250,470 | 10/1993 | Yamaguchi ............................. | 438/113 |
| 5,258,650 | 11/1993 | Polak et al. ............................. | 257/788 |
| 5,311,060 | 5/1994 | Rostoker et al. ........................ | 257/796 |
| 5,336,931 | 8/1994 | Juskey et al. ........................... | 257/787 |
| 5,371,404 | 12/1994 | Juskey et al. ........................... | 257/659 |
| 5,386,342 | 1/1995 | Rostoker ................................. | 361/749 |
| 5,397,746 | 3/1995 | Blish, III ................................. | 438/122 |
| 5,436,203 | 7/1995 | Lin ........................................... | 438/126 |
| 5,468,999 | 11/1995 | Lin et al. ................................. | 257/784 |
| 5,473,512 | 12/1995 | Degani et al. ........................... | 361/760 |
| 5,474,957 | 12/1995 | Urushima ................................ | 438/122 |
| 5,489,059 | 2/1996 | Rostoker et al. ........................ | 228/175 |

(List continued on next page.)

FOREIGN PATENT DOCUMENTS

| | | |
|---|---|---|
| 58-11361 | 1/1980 | Japan . |
| 58-48442 | 3/1983 | Japan . |
| 62-9639 | 1/1987 | Japan . |
| 6-326218 | 11/1994 | Japan . |

OTHER PUBLICATIONS

Banerji, K., "Development of the Slightly Larger Than IC Carrier (SLICC)", Proceedings of the Feb. 27–Mar. 4, 1994, Technical Program NEPCON WEST '94, pp. 1249–1256.

Levine, B. and Guinther, F., "The Package", *Electronic News* vol. 42, No. 2112 (1996), pp. 1, 32.

*Primary Examiner*—Olik Chaudhuri
*Assistant Examiner*—Alonzo Chambliss
*Attorney, Agent, or Firm*—Skjerven, Morrill, MacPherson, Franklin & Friel LLP; Don C. Lawrence

[57] ABSTRACT

A shielded package for an IC chip having bond pads thereon includes an insulating substrate having metallizations formed on a surface of the substrate. The IC chip is mounted to the substrate surface and the IC chip bonding pads are electrically coupled to corresponding substrate metallizations. An insulating encapsulant layer encapsulates the IC chip and the substrate surface. A conductive shield layer comprising a cured flowable electrically conductive material is formed above the encapsulant layer.

The encapsulant layer electrically isolates the shield layer from the IC chip and the various electrical conductors (e.g. bonding pads, bond wires, contacts and metallizations). The shield layer, being an electrically conductive material, forms a floating ground plane which shields the IC chip and the remainder of the package. Thus, the shield layer prevents external radiation form interfering with the operation of the package and also prevents the package from emitting radiation which could interfere with other electronic components and devices.

17 Claims, 12 Drawing Sheets

U.S. PATENT DOCUMENTS

| | | | |
|---|---|---|---|
| 5,578,525 | 11/1996 | Mizukoshi | 438/125 |
| 5,593,926 | 1/1997 | Fujihara | 438/114 |
| 5,596,485 | 1/1997 | Glenn et al. | 361/703 |
| 5,600,181 | 2/1997 | Scott et al. | 257/723 |
| 5,612,513 | 3/1997 | Tuttle et al. | 174/260 |
| 5,639,989 | 6/1997 | Higgins, III | 174/35 MS |
| 5,700,981 | 12/1997 | Tuttle et al. | 174/250 |
| 5,719,440 | 2/1998 | Moden | 257/697 |
| 5,767,447 | 6/1998 | Dudderar et al. | 174/52.4 |
| 5,776,798 | 7/1998 | Quan et al. | 438/112 |
| 5,973,263 | 10/1999 | Tuttle et al. | 174/52.2 |
| 5,973,337 | 10/1999 | Knapp et al. | 257/99 |
| 5,981,314 | 11/1999 | Glenn et al. | 438/127 |
| 5,990,545 | 10/1999 | Schueller et al. | 257/697 |

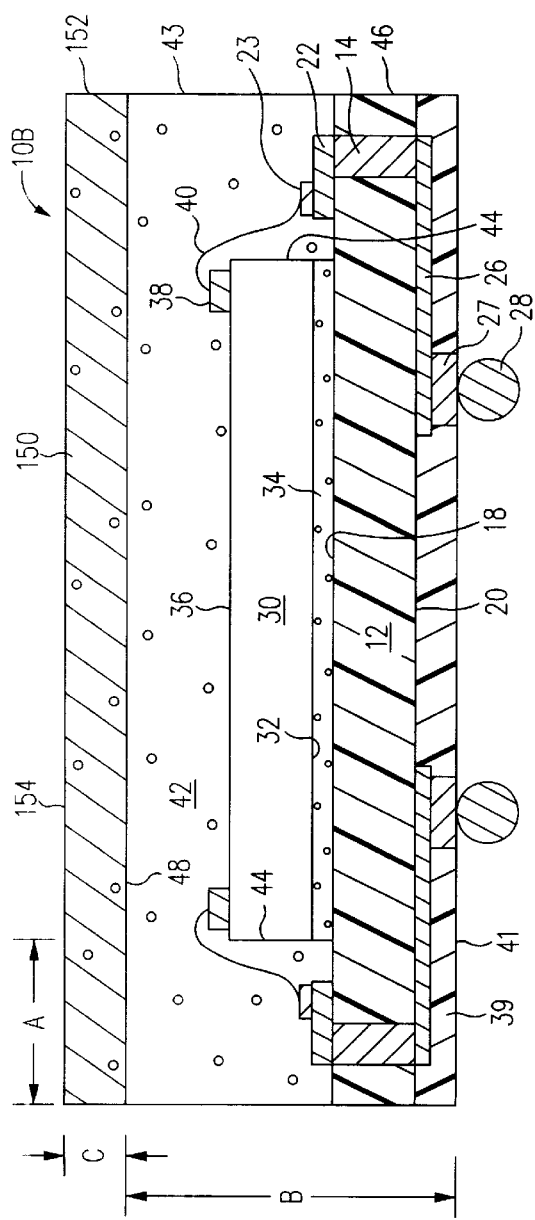
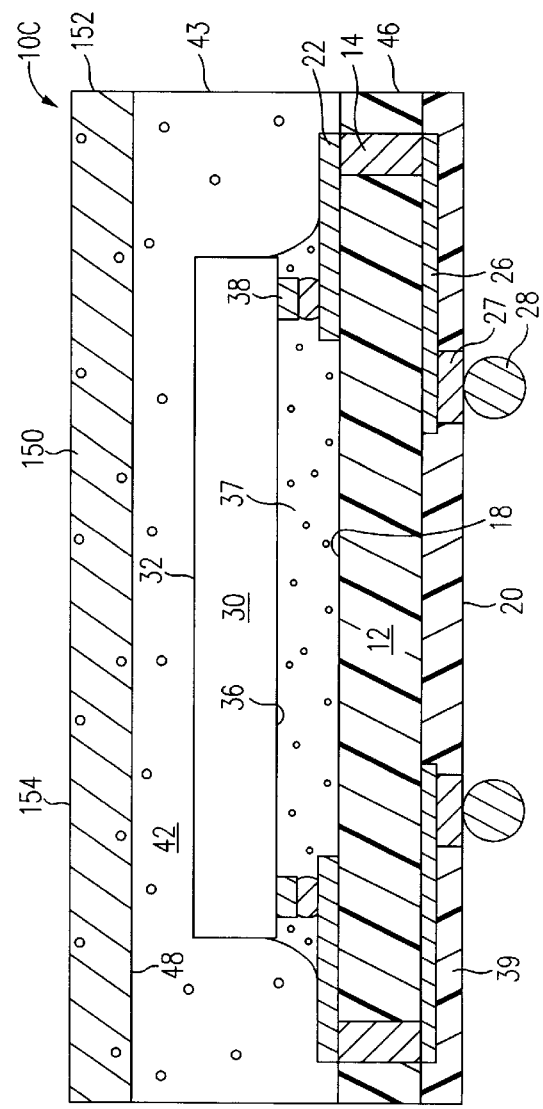
FIG. 3
FIG. 4

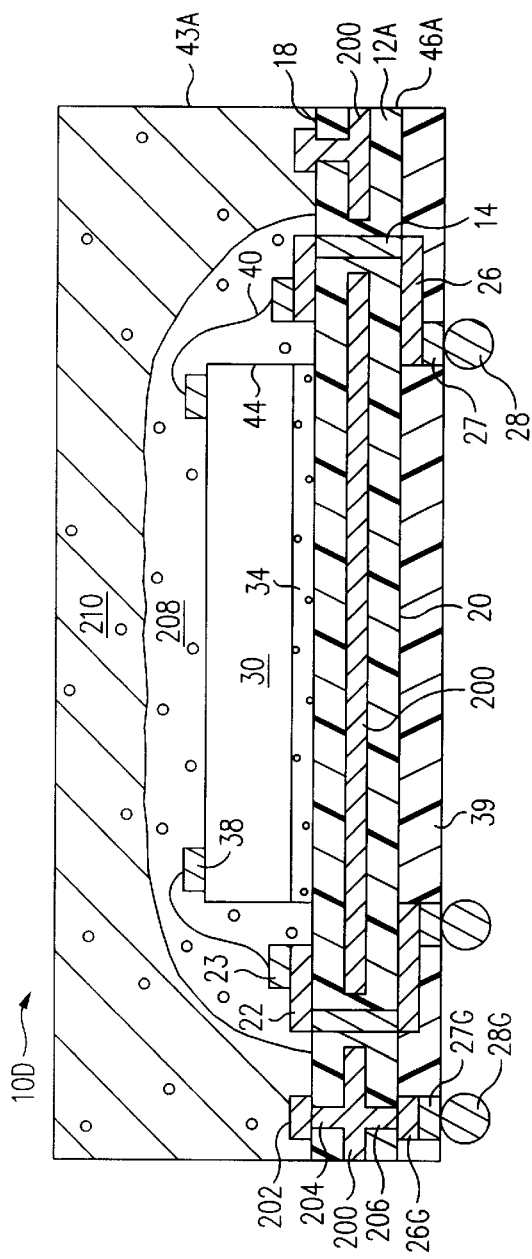
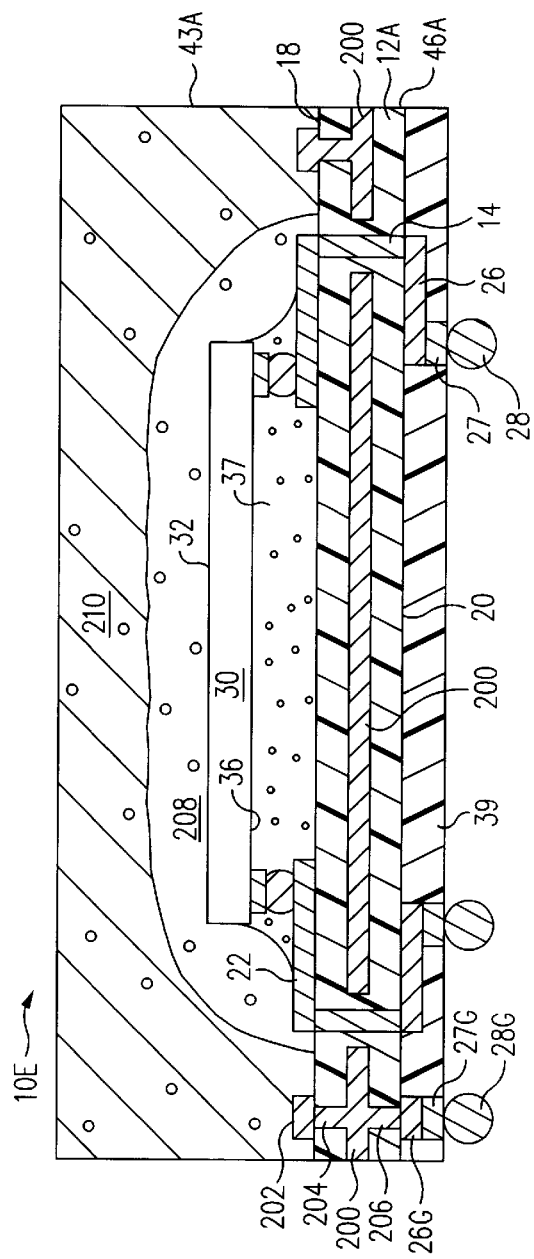
FIG. 5
FIG. 6

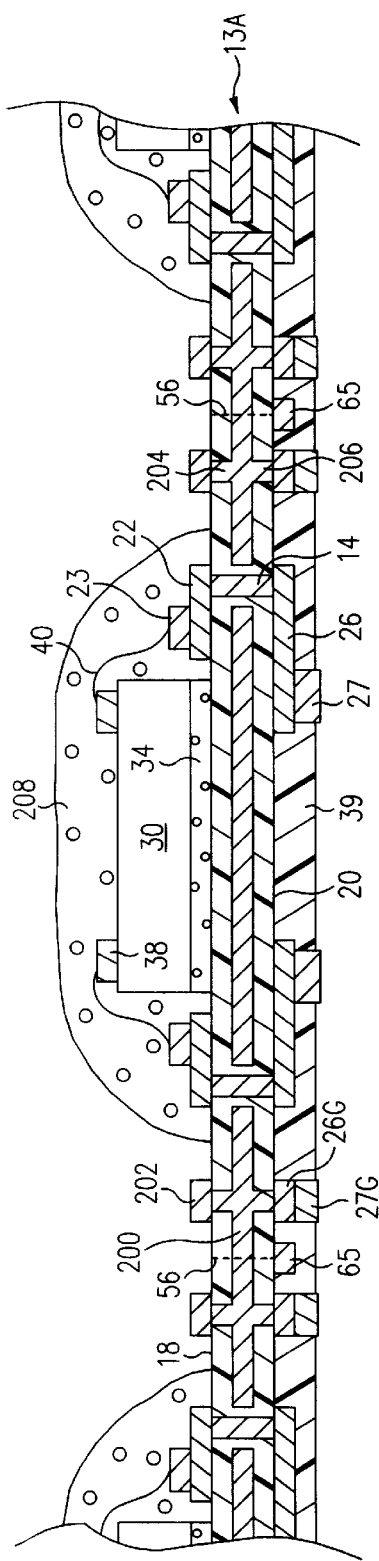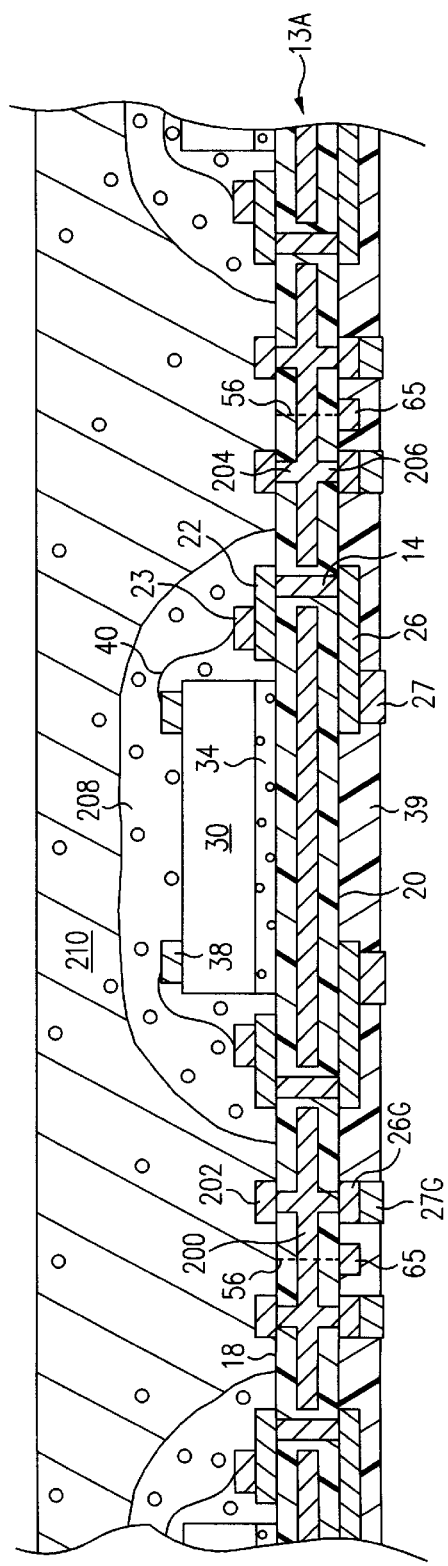

RF SHIELDED DEVICE

CROSS-REFERENCE TO RELATED APPLICATION

This application is a continuation-in-part of U.S. patent application Ser. No. 08/741,797, filed Oct. 31, 1996, now U.S. Pat. No. 5,981,314, by Thomas P. Glenn et al., entitled "NEAR CHIP SIZE INTEGRATED CIRCUIT PACKAGE" herein incorporated by reference in its entirety.

FIELD OF THE INVENTION

The present invention relates to the art of electronic packaging and more particularly to a method of packaging an integrated circuit chip and the resulting structure.

BACKGROUND OF THE INVENTION

Electronic devices have increasingly become more compact and lightweight. Correspondingly, the size and spacing between integrated circuit chip (IC chip) packages and other electronic components used in the electronic devices have also decreased.

As the spacing between IC chip packages and other electronic components decreases, shielding becomes increasingly important. Shielding prevents radiation emanating from an IC chip package from interfering with adjacent electronic components and also prevents radiation emanating from the adjacent electronic components from interfering with the IC chip package (this type of radiation is typically referred to as crosstalk). Shielding is typically accomplished by covering the IC chip package and/or electronic components with a preformed piece of metal such as copper. However, metal shielding is relatively expensive and inhibits reduction in weight and size of electronic devices.

Higgins, U.S. Pat. No. 5,639,989 (hereinafter Higgins), herein incorporated by reference in its entirety, teaches a method of shielding an electronic component assembly. The method includes forming a conformal electrically insulating layer over a semiconductor device and over signal traces. An electrically conductive conformal shielding layer is then deposited over the insulating layer, wherein the electrically conductive shielding layer is a particulate-filled polymer.

As shown in Higgins FIG. 2, the conformal electrically insulating/conductive layers are formed after the semiconductor devices are attached to a larger substrate such as a printed circuit board. In this manner, crosstalk between adjacent semiconductor devices is prevented. However, applying the electrically insulating/conductive layers after the semiconductor devices are attached to the printed circuit board adds complexity to the manufacturing process and hinders reworking the assembly. Accordingly, it is desirable to incorporate shielding into the IC chip packaging itself thus avoiding the additional manufacturing step of shielding after the IC chip packages are assembled to the printed circuit board.

Lin, U.S. Pat. No. 5,436,203 (hereinafter Lin), herein incorporated by reference in its entirety, teaches a shielded IC chip package. Referring to Lin FIG. 4, to form the shielded IC chip package, a first dam structure 40 is formed and used to constrain the flow of an electrically insulating encapsulant 38. After IC chip 32 is encapsulated in electrically insulating encapsulant 38, a second dam structure 44 is formed and used to constrain the flow of an electrically conductive encapsulant 42.

Electrically conductive encapsulant 42 is electrically tied to an internal reference plane 22 by reference pads 18 and conductive vias 20. Thus, IC chip 32 is effectively shielded from both the top and bottom by the combination of electrically conductive encapsulant 42 and internal reference plane 22.

Although the shielded IC chip package of Lin is effective in shielding, the resulting package is relatively large and expensive to manufacture. In particular, a first amount of substrate area is necessary to form first dam structure 40, a second amount of substrate area is necessary to form second dam structure 44 and a third amount of substrate area between dam structure 40 and 44 is necessary to allow electrical interconnection between electrically conductive encapsulant 42 and reference pads 18. As a result, the shielded IC chip package of Lin is substantially larger than the package IC chip 32. Further, formation of two dam structure 40 and 44 is relatively complex, adding to the manufacturing cost of forming the shielded IC chip package. Accordingly, a need exists for a shielded IC chip package which is near chip size, lightweight and relatively inexpensive to manufacture.

SUMMARY OF THE INVENTION

In accordance with the present invention, a shielded package for an IC chip having bond pads thereon includes an insulating substrate having metallizations formed on a surface of the substrate. The IC chip is mounted to the substrate surface and the IC chip bonding pads are electrically coupled to corresponding substrate metallizations. An electrically insulating encapsulant layer encapsulates the IC chip and the substrate surface. An electrically conductive shield layer comprising a cured flowable electrically conductive material is formed above the encapsulant layer.

The encapsulant layer electrically isolates the shield layer from the IC chip and the various electrical conductors (e.g. bonding pads, bond wires, contacts and metallizations). The shield layer, being an electrically conductive material, forms a floating ground plane which shields the IC chip and the remainder of the package. Thus, the shield layer prevents external radiation from interfering with the operation of the package and also prevents the package from emitting radiation which could interfere with other electronic components and devices.

Forming the shield layer from a cured flowable electrically conductive material in contrast to a preformed metal sheet advantageously reduces the cost and weight of the package. Further, the problems associated with embedding a metal sheet into encapsulant (e.g. delamination and thermal cracking) are avoided.

Also in accordance with the present invention, a method of packaging a plurality of IC chips includes the step of providing an insulating substrate having sections. The IC chips are mounted in the sections and then encapsulated in an insulating encapsulant layer. A conductive shield layer is then applied above the encapsulant layer, the shield layer comprising a flowable electrically conductive material. The encapsulant layer, shield layer and insulating substrate are then cut along a periphery of each of the sections to form a plurality of shielded packages.

Fabricating a plurality of shielded packages simultaneously, in contrast to individually, from a single substrate advantageously reduces handling costs thereby reducing the cost of fabricating each individual package. Further, by fabricating a plurality of packages simultaneously from a single substrate, waste or trimming of the substrate is reduced or essentially eliminated thereby further reducing the cost of fabricating each individual package. (In contrast, when integrated circuit packages are fabricated individually, the substrate is slightly oversized to allow handling of the substrate, and the excess substrate is trimmed in subsequent fabrication steps.)

In another embodiment, a fully shielded package for an IC chip includes an insulated substrate having an internal ground plane, the IC chip being mounted on the insulating substrate. The package further includes an electrically insulating cap which encloses the IC chip and a first portion of the insulating substrate, and an electrically conductive shield layer which encloses the cap and a second portion of the insulating substrate. Ground contacts located on the second portion of the insulating substrate are electrically coupled to the internal ground plane and also to the shield layer. In this manner, the IC chip is fully shielded from the top and sides by the shield layer and from below by the ground plane.

To form a plurality of the fully shielded packages, an insulating substrate having sections and an internal ground plane is provided. Each of the sections of the insulating substrate includes a first portion and a second portion, the IC chips being mounted in the first portions. The IC chips and first portions are then enclosed in an electrically insulating cap. The caps and second portions of the insulating substrate are then enclosed in an electrically conductive shield layer. Ground contacts on the second portions of the insulating substrate and electrically conductive through-holes electrically couple the shield layer to the internal ground plane. The shield layer and insulating substrate are then cut along a periphery of each of the sections to form the individual fully shield packages.

These and other objects, features and advantages of the present invention will be more readily apparent from the detailed description of the preferred embodiments set forth below taken in conjunction with the accompanying drawings.

BRIEF DESCRIPTION OF THE DRAWINGS

FIGS. 3 and 4 are cross-sectional views of shielded packages in accordance with alternative embodiments of the present invention.

FIGS. 5 and 6 are cross-sectional views of fully shielded packages in accordance with other alternative embodiments of the present invention.

FIGS. 19 and 20 are cross-sectional views of a fully shielded package at various stages during fabrication in accordance with an alternative embodiment of the present invention.

DESCRIPTION OF THE PREFERRED EMBODIMENTS

In accordance with the present invention, a near chip size integrated circuit package, called a CHIPARRAY™ package, is presented.

Several elements shown in the following figures are substantially similar. Therefore, similar reference numbers are used to represent similar elements.

Figure 1:
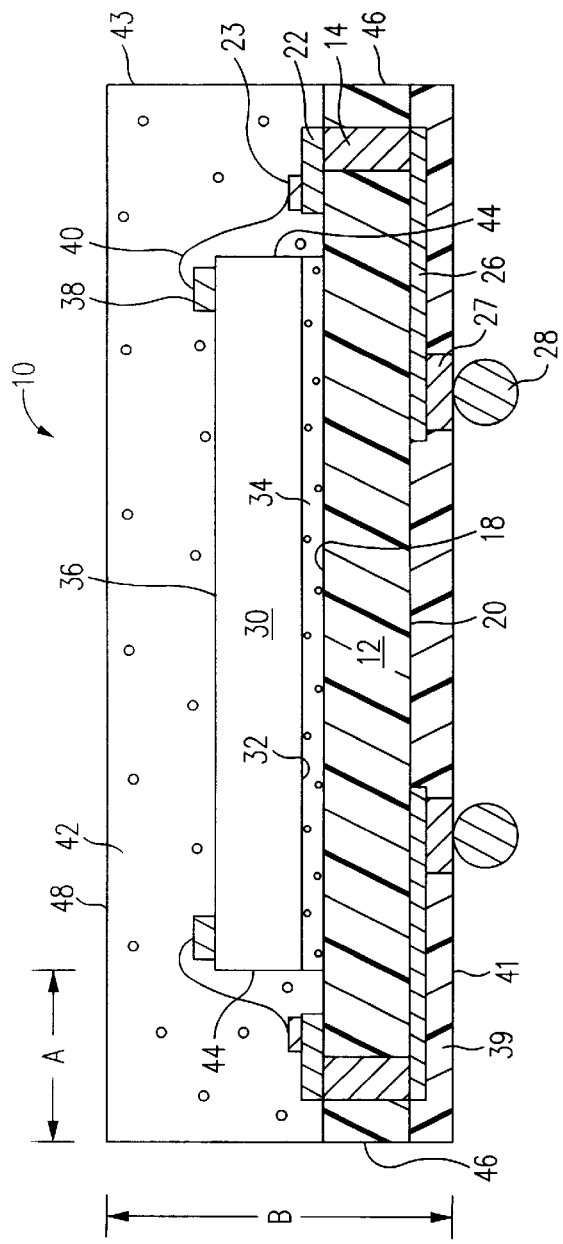
FIGS. 1 and 2 are cross-sectional views of packages in accordance with the present invention.

FIG. 1 is a cross-sectional view of a package 10 in accordance with one embodiment of the present invention. Package 10 includes an insulating substrate 12 having electrically conductive through-holes 14 (also referred to as vias). For example, by drilling holes in substrate 12 and then plating the drilled holes with a conductive material such as copper, conductive through-holes 14 are formed. Illustratively, copper is plated to a minimum thickness of 600 micro inches ($\mu$ in).

Substrate 12 is typically a ceramic, a laminate, a passivated metal or a printed circuit board substrate material. Examples of suitable ceramic substrates include 98% alumina or 98% aluminum nitride ceramic substrates available from Sumitomo, Kyocera, NTK and Coors. Examples of suitable laminate substrates include BT (Mitsubishi), FR-4, FR-5, Arlon and GTEK (Matsushita Electric) Laminate Substrates. An example of a suitable passivated metal substrate includes an anodized aluminum substrate available from Alcoa.

Conductive through-holes 14 extend from a first surface 18 to a second surface 20 of substrate 12. Formed on first surface 18 are electrically conductive traces or metallizations 22, typically formed of copper, each of which is electrically connected on a first end to a corresponding conductive through-hole 14. A contact 23 is formed on each metallization 22. Contact 23 is preferably a layer of gold or a multi-layer-metallization with a gold outer layer. In one embodiment, contact 23 is a nickel layer and overlying gold layer with minimum thicknesses of $200\mu$ in and $20\mu$ in, respectively.

Formed on second surface 20 are electrically conductive traces or metallizations 26, typically formed of copper, each electrically connected on a first end to a corresponding conductive through-hole 14. Formed on a second end of each metallization 26 is a contact 27 which is similar to contact 23.

Metallizations 22, 26 can be formed, for example, by masking and etching conductive layers formed on first and second surfaces 18, 20 of substrate 12. Contacts 23, 27 are formed using conventional processes such as electroplating or electro-less plating.

Formed on contacts 27 are interconnection balls 28, each of which is electrically connected to a second end of a metallization 26 by a contact 27. Interconnection balls 28 allow interconnection between package 10 and other electrical components (not shown).

Interconnection balls 28 are typically arranged in an array thus forming a ball grid array. In an alternative embodiment, instead of forming interconnection balls 28, contacts 27 are used as interconnection pads. In this embodiment, the typical minimum spacing between adjacent interconnection pads (contacts 27) is 0.30 millimeter (mm) to 1.00 mm.

In other embodiments, the interconnection balls or interconnection pads are not arranged in array but are located near the perimeter of package 10, i.e. are located near edges 46 of substrate 12.

In FIG. 1, a specific electrically conductive pathway between interconnection ball 28 and metallization 22 is illustrated which comprises contact 27, metallization 26 and conductive through-hole 14. However, it is understood that other electrically conductive pathways between interconnection ball 28 (or an interconnection pad) can be formed. For example, substrate 12 can be a multi-layer laminate substrate having a plurality of electrically conductive vias electrically connecting conductive traces formed on various layers as is well known to those skilled in the art. Thus, it is to be understood that the electrically conductive pathway formed by contact 27, metallization 26 and conductive through-hole 14 is simply illustrative and not limiting, and that other electrically conductive pathways can be formed between the interconnection balls or interconnection pads and the corresponding metallizations 22.

Mounted to first surface 18 of substrate 12 is an integrated circuit (IC) chip 30. In particular, a first surface 32 of IC chip 30 is mounted to first surface 18 of substrate 12 typically by a layer of epoxy adhesive 34. Formed on a second surface 36, opposite first surface 32, of IC chip 30 are bonding pads 38. Bonding pads 38 are electrically connected to the internal electronic components of IC chip 30. Each bonding pad 38 is electrically connected to a corresponding metallization 22 by a bond wire 40 which is bonded to contact 23. Thus, an electrically conductive pathway is formed from each interconnection ball 28 to the corresponding bonding pad 38.

Second surface 36 of IC chip 30, bonding pads 38, bond wires 40, the exposed first surface 18 of substrate 12, contacts 23 and metallizations 22 are encapsulated in a layer of encapsulant 42. As shown in FIG. 1, edges 43 of layer of encapsulant 42 are coincident with edges 46 of substrate 12. Formed over portions of second surface 20 and metallizations 26 is an electrically insulating solder mask 39 which does not cover contacts 27 or interconnection balls 28. Solder mask 39 is applied and patterned using conventional techniques.

Package 10 is a near chip size integrated circuit package, i.e. the distance A between any edge 44 of IC chip 30 and any edge 46 of substrate 12 can be as small or smaller than 10 mil and typically is between 40 to 60 mil and in one embodiment is 30 mil (1 mil=1/1000 inch). Further, the distance B between upper surface 48 of layer of encapsulant 42 and lower surface 41 of solder mask 39 is generally less than 60 mil and typically is between 40–60 mil and in particular depends in part upon the thickness of substrate 12, the thickness of IC chip 30 and the thickness of layer of encapsulant 42 over IC chip 30. For example, substrate 12 has a thickness of 0.36 millimeter (mm) or 0.56 mm, IC chip 30 has a thickness of 0.010 in. to 0.013 in., preferably 0.011 in. and layer of encapsulant 42 over IC chip 30 has a thickness of 0.011 in. Since package 10 is near chip size, package 10 is particularly advantageous in applications where limited space for the IC chip package is available such as in disk drive applications.

Figure 2:
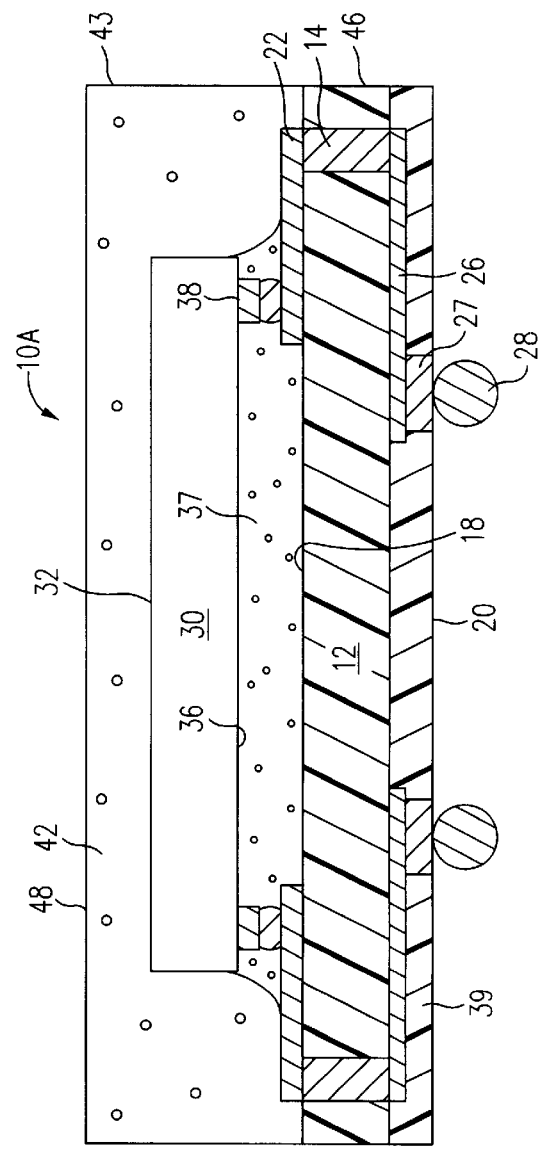

FIG. 2 is a cross-sectional view of a package 10A in which a flip-chip interconnection is formed in accordance with an alternative embodiment of the present invention. As shown in FIG. 2, IC chip 30 is mounted to substrate 12 using a flip-chip interconnection. More particularly, in this embodiment, second surface 36 of IC chip 30 is placed adjacent first surface 18 of substrate 12 and bonding pads 38 are electrically connected to metallizations 22 directly, for example by solder. (In FIG. 2, bonding pads 38 are bonded directly to metallizations 22 although, alternatively, bonding pads 38 can be bonded to contacts 23 (FIG. 1) on metallization 22.) Accordingly, bond wires 40 of FIG. 1 are unnecessary and therefore eliminated. An underfill material 37 is applied to fill the space between IC chip 30 and substrate 12 which also encapsulates the flip chip interconnection with bonding pads 38. In all other aspects, package 10A is substantially similar to package 10 in FIG. 1.

FIG. 3 is a cross-sectional view of a shielded package 10B in accordance with an alternative embodiment of the present invention. Shielded package 10B of FIG. 3 is substantially similar to package 10 of FIG. 1 except for the inclusion of an electrically conductive shield layer 150. Referring to FIG. 3, shield layer 150 is formed on upper surface 48 of layer of encapsulant 42. Shield layer 150 has edges 152 which are coincident with edges 43 of layer of encapsulant 42 and edges 46 of substrate 12. Further, shield layer 150 has a planar upper surface 154 and has a substantially uniform thickness C between surfaces 48 and 154. In one embodiment, thickness C is in the range of 8 to 10 mil.

Shield layer 150 is formed of a flowable electrically conductive material which has been cured.

For example, shield layer 150 is formed from a polymer containing an electrically conductive filler (hereinafter referred to as an electrically conductive liquid encapsulant). Shield layer 150 is electrically isolated from IC chip 30 and the various electrical conductors (i.e. bonding pads 38, bond wires 40, contacts 23 and metallizations 22) by layer of encapsulant 42 which is an electrically insulating material.

Typically, layer of encapsulant 42 is formed of a polymer which is similar to, or the same as, the polymer of shield layer 150. This avoids difficulties such as mismatch in the thermal coefficient of expansion between shield layer 150 and layer of encapsulant 42 and improves physical bonding between shield layer 150 and layer of encapsulant 42.

Shield layer 150, being an electrically conductive layer, forms a floating ground plane which shields IC chip 30 and the remainder of shielded package 10B. Thus, shield layer 150 prevents external radiation from interfering with the operation of shielded package 10B and also prevents shielded package 10B from emitting radiation which could interfere with other electronic components and devices. (Some minimal amount of radiation may pass in/out of shielded package 10B through edges 43 of layer of encapsulant 42 and through substrate 12. However, this is acceptable for most applications since a certain amount of radiation is tolerable without any loss of performance.)

Forming shield layer 150 from an electrically conductive encapsulant in contrast to a preformed metal sheet advantageously reduces the cost and weight of shielded package 10B. Further, the problems associated with embedding a metal sheet into encapsulant (e.g. delamination and thermal cracking) are avoided.

FIG. 4 is a cross-sectional view of a shielded package 10C in accordance with an alternative embodiment of the present invention. Shielded package 10C of FIG. 4 is substantially similar to shielded package 10B of FIG. 3 except that a flip-chip interconnection is used to mount IC chip 30 to substrate 12.

FIG. 5 is a cross-sectional view of a fully shielded package 10D in accordance with an alternative embodiment of the present invention. Referring to FIG. 5, substrate 12A includes an internal ground plane 200. Ground plane 200 has apertures through which conductive through-holes 14 pass. Thus, ground plane 200 is electrically isolated from conductive through-holes 14. Ground plane 200 is electrically connected to at least one ground contact 202 on first surface 18 of substrate 12A by electrically conductive through-holes 204. Ground plane 200 is also electrically connected to at least one ground interconnection ball 28G by electrically conductive through-holes 206, trace 26G and contacts 27G.

As shown in FIG. 5, IC chip 30, including bonding pads 38, bond wires 40, contacts 23 and metallizations 22, are enclosed in an encapsulant cap 208 formed of an electrically insulating encapsulant of importance, encapsulant cap 208 only encloses a portion of first surface 18 of substrate 12A inward of ground contacts 202, i.e. does not enclose ground contacts 202. The remaining portion of first surface 18 of substrate 12A, including ground contacts 202, and encapsulant cap 208, are enclosed in a shield layer 210 formed of an electrically conductive liquid encapsulant similar to that of shield layer 150 of FIG. 3. As shown in FIG. 5, shield layer 210 has edges 43A which are coincident with edges 46A of substrate 12A.

Shield layer 210 is electrically connected to ground plane 200 by ground contacts 202 and through-holes 204. In accordance with this embodiment, IC chip 30 is fully shielded. More particularly, IC chip 30 is shielded from the top and sides by electrically conductive shield layer 210. IC chip 30 is shielded from below by ground plane 200. Advantageously, shield layer 210 and ground plane 200, which are electrically connected and at a common potential, can be electrically connected to an external reference voltage (e.g. ground) by interconnection balls 28G.

In contrast to the shielded IC chip package of Lin (discussed above), fully shielded package 10D does not contain any encapsulant dams (see dam structures 40, 44 of Lin). Accordingly, fully shielded package 10D is fabricated without having to provide substrate area for dam structures. This enables a reduction in the distance between edges 44 of IC chip 30 and edges 46A of substrate 12A, i.e. enables fully shielded package 10D to be near chip size.

FIG. 6 is a cross-sectional view of a fully shielded package 10E in accordance with an alternative embodiment of the present invention. Package 10E of FIG. 6 is substantially similar to package 10D of FIG. 5 except that a flip-chip interconnection is used to mount IC chip 30 to substrate 12.

Figure 7A:
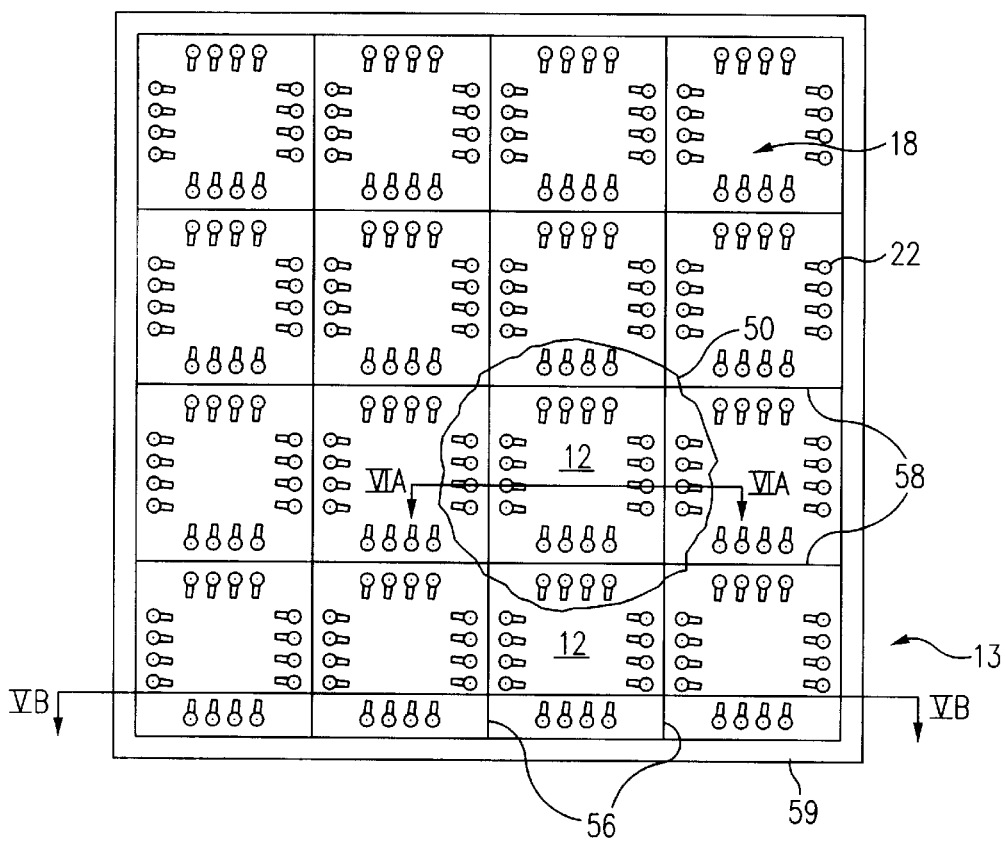
FIGS. 7A and 7C are top plan and bottom plan views, respectively, of a substrate in accordance with the present invention.

FIG. 7A is an enlarged top plan view of a substrate 13 in accordance with the present invention.

In FIG. 7A, a plurality of lines 56 oriented in the vertical direction, as well as a plurality of lines 58 oriented in the horizontal direction are illustrated. Lines 56 and 58 are included in the following figures to clarify the sections 12 where each individual package is to be formed, the formation of which is described in detail below. (For clarity, in FIG. 7A only two sections 12 are labeled). As shown in FIG. 7A, the periphery of each section 12 is defined by lines 56, 58. However, in an alternative embodiment, instead of lines 56, 58, alignment marks are provided for aligning substrate 13 in subsequent processing step such as those described below. Substrate 13 is preferably a square or rectangular substrate, for example is a 2.0 in.×2.0 in. (5.1 cm×5.1 cm), a 3.0 in.×3.0 in. (7.6 cm×7.6 cm) or a 4.0 in.×4.0 in. (10.2 cm×10.2 cm) square substrate.

As shown in FIG. 7A, a dam 59 is formed on a first surface 18 of substrate 13 around the perimeter of substrate 13. Dam 59 encloses sections 12, yet does not extend into any of the section 12.

Figure 7B:
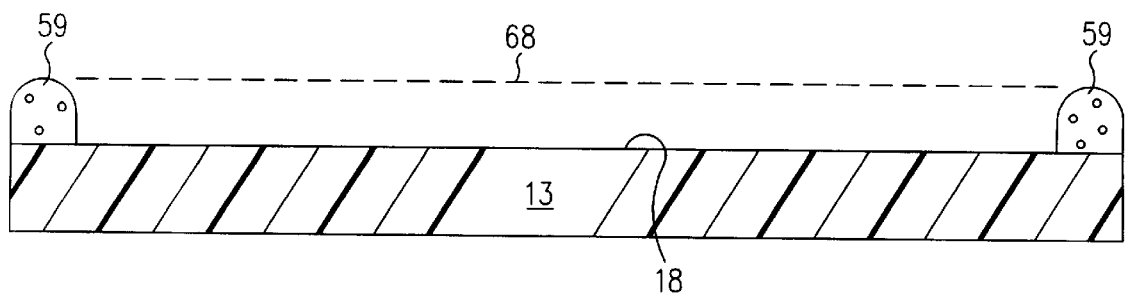
FIG. 7B is a cross-sectional view along the line VB—VB of FIG. 7A of the substrate.

FIG. 7B is a cross-sectional view along the line VB—VB of FIG. 7A of substrate 13. In FIG. 7B, metallizations, conductive through-holes and other features are not illustrated for clarity. As shown in FIG. 7B, dam 59 extends from first surface 18 to a predetermined height indicated by dashed line 68 above first surface 18 thereby defining a pocket which can be filled with one or more encapsulants as described in more detail below.

Dam 59 can be any material suitable for preventing encapsulant from flowing off of substrate 13. In one embodiment, dam 59 is formed by applying and curing an encapsulant (e.g. from a needle dispenser) such as Dexter Hysol 4450 or 4451 or an equivalent.

Referring back to FIG. 7A, each section 12 of substrate 13 has a plurality of metallizations 22 formed on first surface 18 of substrate 13, a plurality of contacts 23 (not shown) formed on metallizations 22 and a plurality of conductive through-holes 14 (not shown) formed through substrate 13. Metallizations 22 are formed using conventional techniques such as by forming a conductive layer on first surface 18 and then by masking and etching the conductive layer. Conductive through-holes 14 are also formed using conventional techniques such as by drilling through-holes in substrate 13 and then plating the drilled through-holes with a conductive metal such as copper.

Figure 7C:
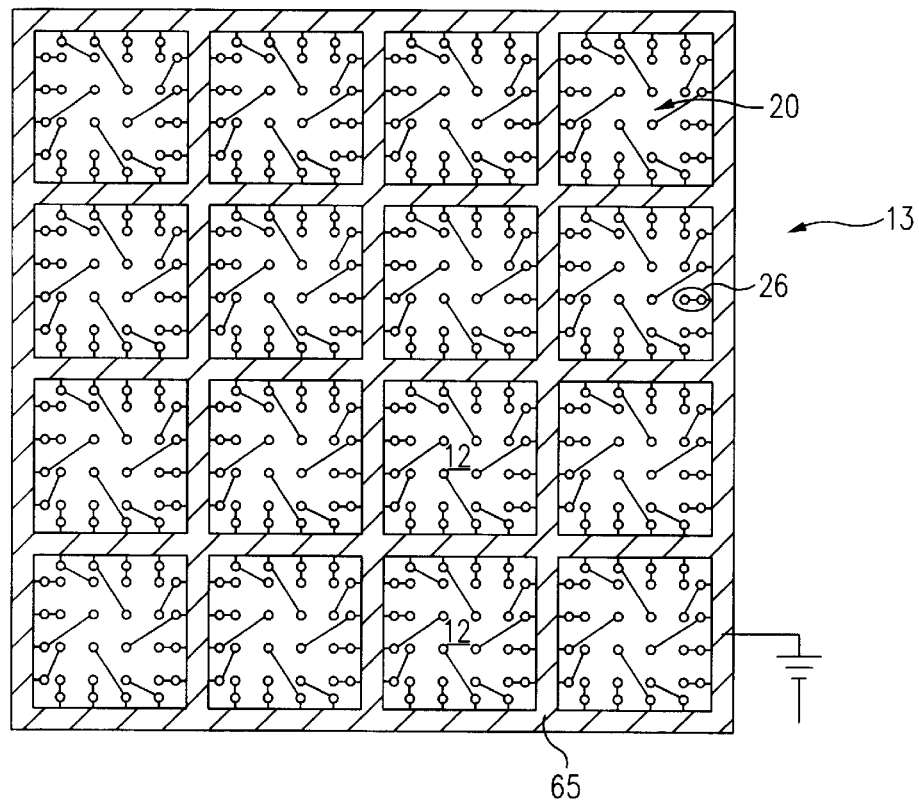

FIG. 7C is a bottom plan view of substrate 13. In FIG. 7C, solder mask 39 is not illustrated for purposes of clarity. As shown in FIG. 7C, around the perimeter of each section 12 on second surface 20 of substrate 13 is a reference grid 65. Reference grid 65 is formed of an electrically conductive material (e.g. the material of metallizations 26) and is typically formed simultaneously with the formation of metallizations 26 (e.g. during the same masking and etching steps used to form metallizations 26).

Metallizations 26 on second surface 20 of substrate 13 are electrically coupled to reference grid 65. In this manner, metallizations 26, conductive through-holes 14 (not shown) and metallizations 22 (not shown) of substrate 13 are electrically coupled to one another and thus are held at a common potential. This enables a voltage to be applied to metallizations 26, 22 and through-holes 14, e.g. for electroplating contacts 23, 27. Further, as shown in FIG. 7C, reference grid 65 can be electrically connected to an external reference voltage (e.g. ground). Connecting reference grid 65 to ground prevents any transient electrical charge from accumulating on (i.e. shorts) metallizations 26, 22 and through-holes 14. In this manner, IC chips 30 are protected from damage due to electrostatic discharge.

FIGS. 8 to 13 illustrate various stages in the formation of a shielded package in accordance with the present invention. Although the formation of a single package is described for clarity, it should be understood that a plurality of packages are formed from a single substrate 13 simultaneously, one package being formed from each section 12 of substrate 13.

Figure 8A:
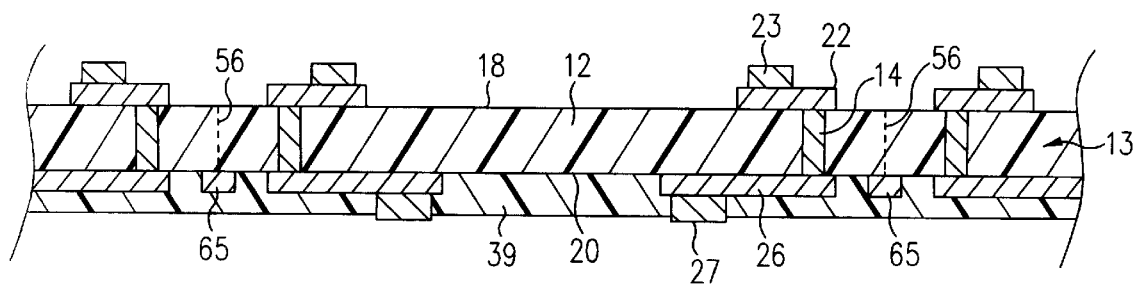
FIGS. 8A, 8B and 8C are cross-sectional (taken along the line VIA—VIA of FIG. 7A), top plan and bottom plan views, respectively, of a region of the substrate of FIG. 7A.

FIG. 8A is a cross-sectional view of substrate 13 and in particular of one of the sections 12 along the line VIA—VIA of FIG. 7A in accordance with one embodiment of the present invention. Contacts 23, metallizations 22, conductive through-holes 14, metallizations 26 and contacts 27 are illustrated in FIG. 8A. Also illustrated are solder mask 39 and reference grid 65. In the cross-section of FIG. 8A, metallizations 26 are discontinuous from reference grid 65 although if taken along a different cross-section (not shown) metallizations 26 and reference grid 65 would appear as a continuous electrical conductor.

Figure 8B:
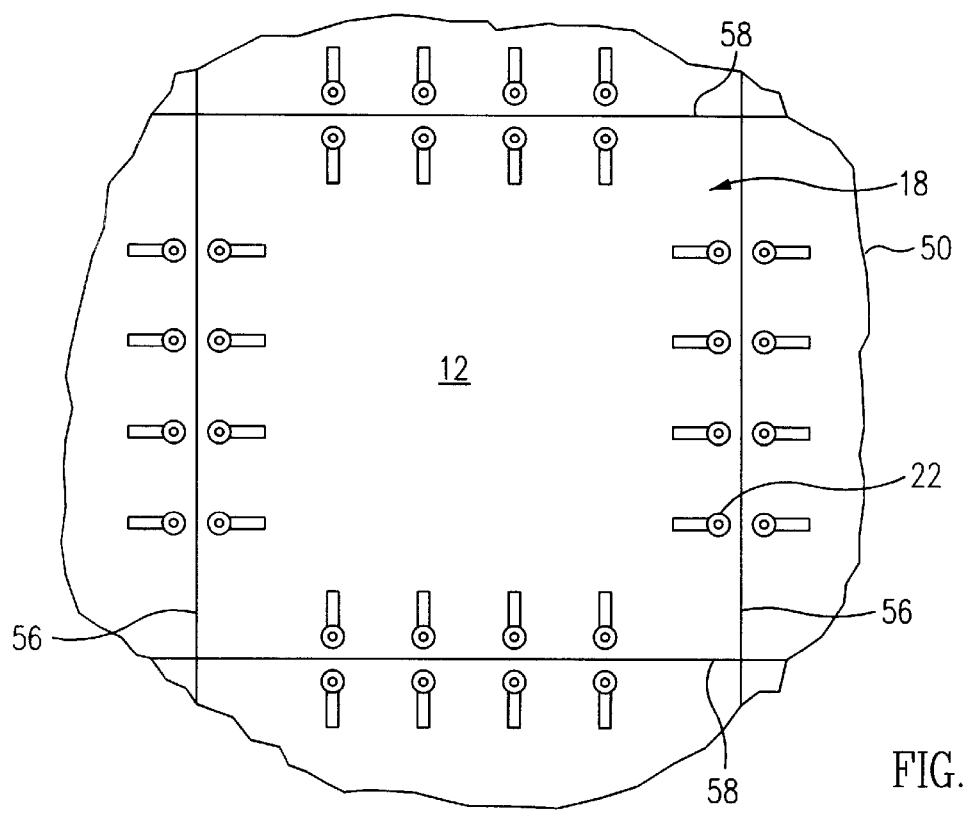

FIG. 8B is a top plan view of a region 50 of substrate 13 from FIG. 7A and in particular of one of the sections 12 illustrating metallizations 22 formed on first surface 18 of substrate 13. Contacts 23 are not illustrated in FIG. 8B for purposes of clarity. In one embodiment, metallizations 22 are a minimum of 0.017 in. long and a minimum of 0.005 in. wide although metallizations 22 with other dimensions can be used.

Figure 8C:
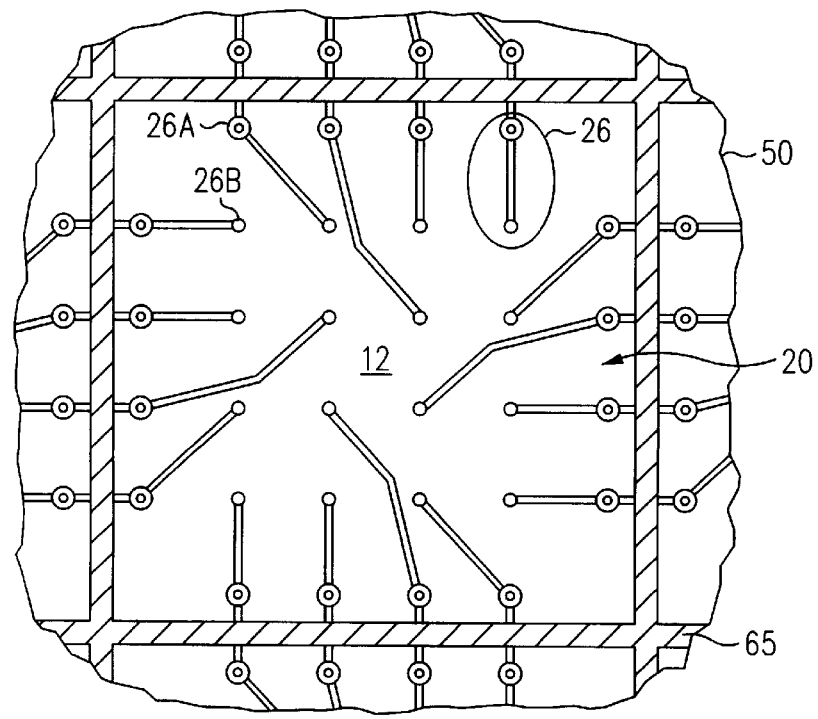

FIG. 8C is a bottom plan view of region 50 of substrate 13 from FIG. 7A illustrating a plurality of metallizations 26 formed on second surface 20 of substrate 13. In FIG. 8C, solder mask 39 is not illustrated for purposes of clarity.

As shown in FIG. 8C, each metallization 26 has a first end 26A which is electrically connected to a conductive through-hole 14 and also to reference grid 65. Metallizations 26 are formed using conventional techniques such as by forming a conductive layer on second surface 20 and then by masking and etching the conductive layer. Contacts 27 (not shown in FIG. 8C for purposes of clarity) are formed on metallizations 26 at second ends 26B.

Figure 9A:
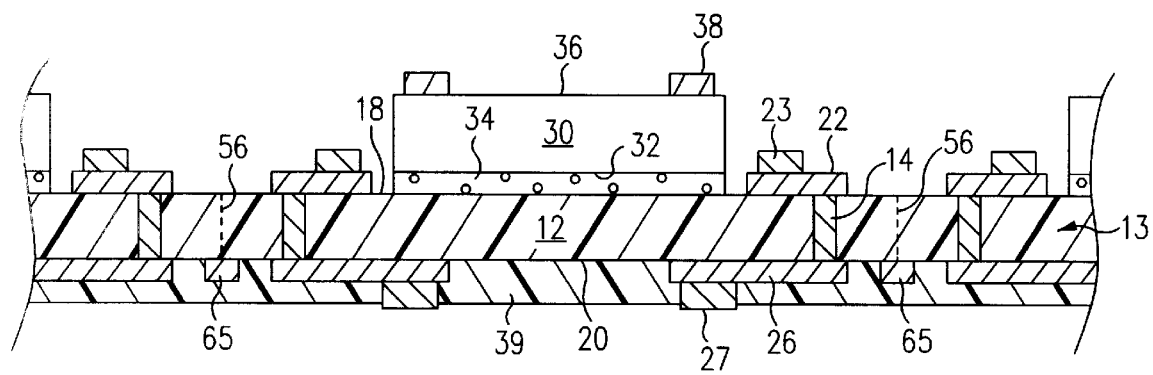
FIGS. 9A, 10A, 11, 12 and 9B, 10B are cross-sectional and top plan views, respectively, of a shielded package at various stages during fabrication in accordance with the present invention.
Figure 9B:
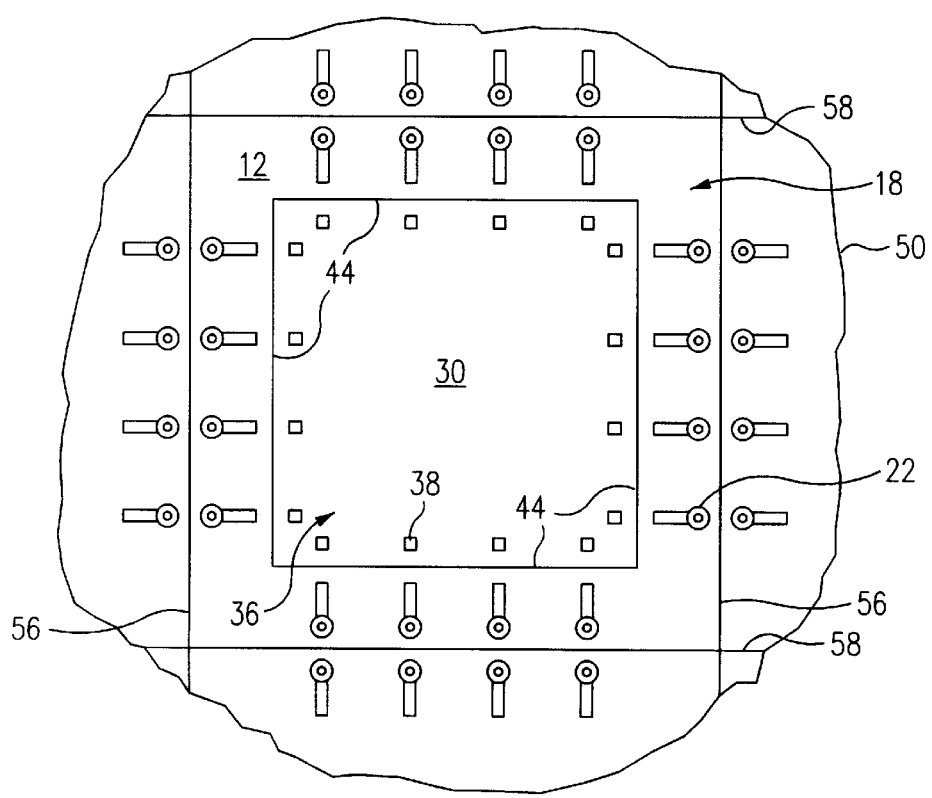

FIGS. 9A and 9B are cross-sectional and top plan views, respectively, of shielded package 10B (FIG. 3) during fabrication. As shown in FIG. 9A, first surface 32 of IC chip 30 is mounted to first surface 18 of substrate 13 by adhesive 34. Adhesive 34 is preferably epoxy adhesive such as Ablestick 965-IL or 8360, QMI 595 or an equivalent.

As shown in FIG. 9B, IC chip 30 is mounted to section 12 in a location central to metallizations 22 and in one embodiment the distance between the edges 44 of IC chip 30 and metallizations 22 is approximately 10 mils. Also shown are bonding pads 38 located on second surface 36 of IC chip 30. In FIG. 9B, metallizations 22 are illustrated adjacent all four edges 44 of IC chip 30. However, in an alternative embodiment, metallizations 22 are not formed along one or more edges 44. In this alternative embodiment, the distance between an edge 44 not having adjacent metallizations 22 and line 56 (or 58) can be reduced as compared to the distance between an edge 44 having adjacent metallization 22 and line 56 (or 58). For example, the distance is reduced to 15 mils.

Figure 10A:
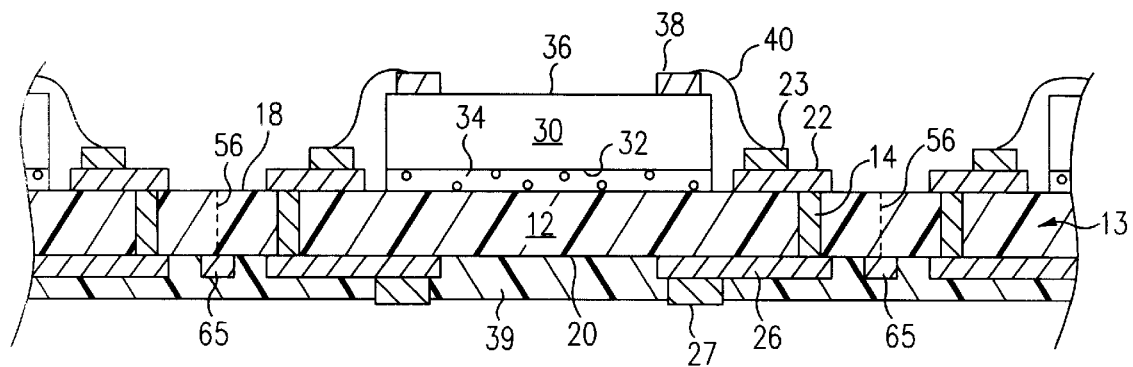
Figure 10B:
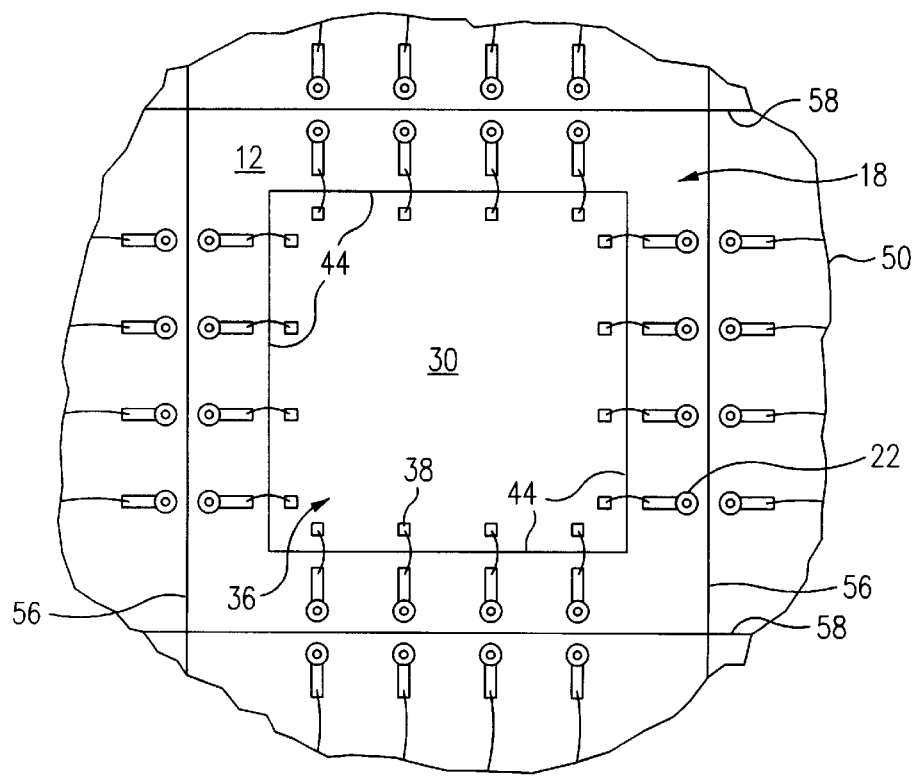

FIGS. 10A and 10B are cross-sectional and top plan views, respectively, of shielded package 10B further along in processing. As shown in FIGS. 10A and 10B, bonding pads 38 are electrically connected to corresponding contacts 23 by bond wires 40, made of gold or aluminum for example, using conventional wire bonding techniques. Examples of suitable wire bonding techniques include gold ultrasonic, aluminum ultrasonic and gold thermocompression techniques. By using gold plated contacts 23, a better bond is formed between metallizations 22 and bond wires 40. However, in an alternative embodiment, contacts 23 are not formed and bond wires 40 are directly bonded to the corresponding metallizations 22.

In an alternative embodiment (not shown) instead of mounting first surface 32 of IC chip 30 to first surface 18 of substrate 13 as illustrated in FIGS. 9A, 9B, 10A, 10B, IC chip 30 is mounted to substrate 13 using a flip chip interconnection. In this embodiment (not shown), second surface 36 of IC chip 30 is placed adjacent first surface 18 of substrate 13 and bonding pads 38 are electrically connected to metallizations 22 directly, for example by solder. An underfill material 37 (see FIG. 4) is applied to fill the space between IC chip 30 and substrate 13 and also to encapsulate the flip chip interconnection between bonding pads 38 and metallizations 22. For example, the underfill material is Dexter Hysol 4511, Alpha Metals EL18, Hokuriku XF8413 or an equivalent. In all other aspects, processing is identical to processing used to fabricate shielded package 10B in FIG. 3 and results in shielded package 10C in FIG. 4.

Figure 11:
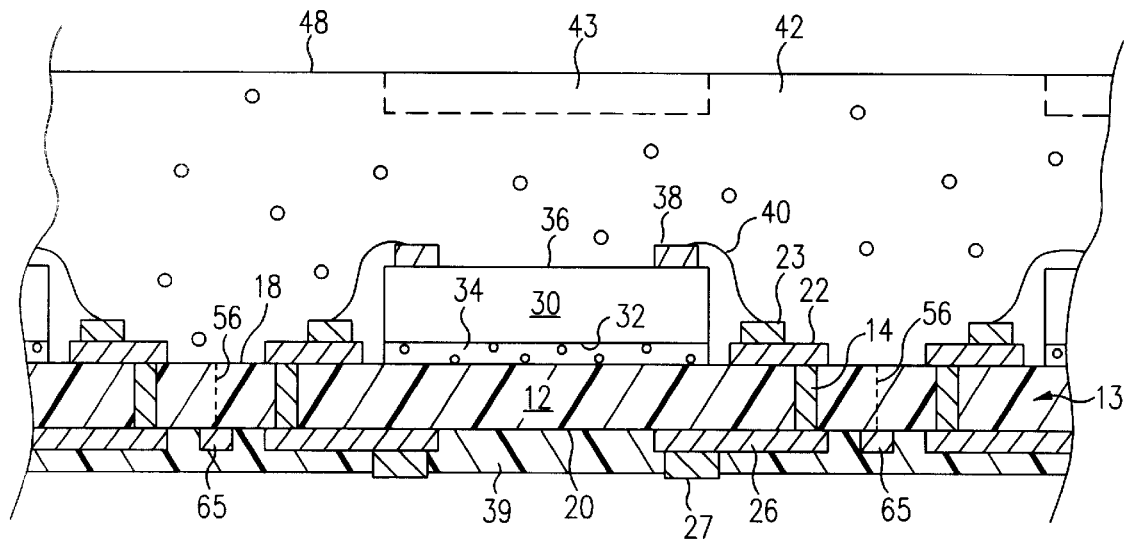

FIG. 11 is a cross-sectional view of shielded package 10B further along in processing. As shown in FIG. 11, a layer of encapsulant 42 is applied over the entire assembly and then cured. In particular, layer of encapsulant 42 covers IC chip 30 including bonding pads 38, bond wires 40, contacts 23, metallizations 22 and the remaining exposed first surface 18 of substrate 13. Layer of encapsulant 42 is formed of an electrically insulating encapsulant and preferably is Dexter Hysol 4450 or 4451 or an equivalent.

As illustrated by the dashed rectangle in FIG. 11, a heat slug 43 such as that set forth in Glenn et al. U.S. Pat. No. 5,596,485, herein incorporated by reference in it entirety, can be embedded into layer of encapsulant 42 to improve the heat transfer from IC chip 30 to the outside environment. Heat slug 43 is typically a copper heat slug and is simply pressed into layer of encapsulant 42 as the encapsulant solidifies. Heat slug 43 is not illustrated in subsequent processing steps or in FIGS. 1–6 although it is understood that a heat slug can be incorporated into the embodiments illustrated by these figures. As a further alternative, an electrically insulating thermally conductive filler such as aluminum nitrate can be added to layer of encapsulant 42 to improve the heat transfer from IC chip 30 to the outside environment.

Figure 12:
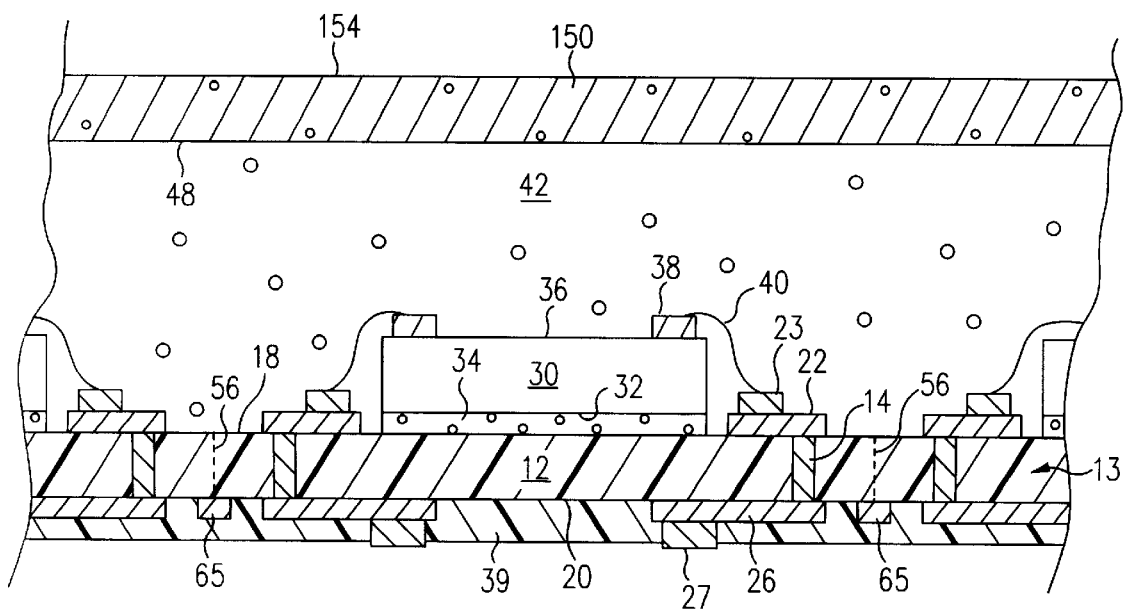

FIG. 12 is a cross-sectional view of shielded package 10B further along in processing. As shown in FIG. 12, after layer of encapsulant 42 is cured, shield layer 150 is applied over the entire assembly and in particular on upper surface 48 of layer of encapsulant 42. After curing, shield layer 150 can be laser marked for product identification using conventional laser marking techniques.

Referring back to FIGS. 7A and 7B, and in particular to FIG. 7B, layer of encapsulant 42 (FIG. 12) is applied by partially filling the pocket defined by dam 59 with an electrically insulating liquid encapsulant. Shield layer 150 is then applied by filling the remainder of the pocket defined by dam 59 with an electrically conductive liquid encapsulant. Dam 59 prevents layer of encapsulant 42 and shield layer 150 from flowing off of first surface 18 of substrate 13. Preferably, dam 59 has a height indicated by dashed line 68 above first surface 18 greater than or equal to the height of upper surface 154 of shield layer 150 above first surface 18. Of importance, use of dam 59 insures that layer of encapsulant 42 and shield layer 150 have uniform thickness, e.g. no greater than 10% variation in thickness over the entire area of substrate 13.

Referring again to FIG. 12, instead of using an electrically conductive liquid encapsulant to form shield layer 150, shield layer 150 can be an electrically conductive plate or screen material. In this alternative, the plate or screen is pressed into layer of encapsulant 42 before curing so that the upper surface of layer of encapsulant 42 is surface 154 (and item 48 is the lower surface of the plate or screen), i.e. the plate or screen is contained in layer of encapsulant 42 with the possible exception of the upper surface of the plate or screen which may be exposed to the outside environment. Preferably, the plate or screen has apertures large enough to allow any air trapped below the plate or screen or in layer of encapsulant 42 to escape. See Glenn et al., U.S. Pat. No. 5,596,485, cited above, for a discussion of the use of apertures to avoid air bubble entrapment. As a further alternative, the plate or screen can be only partially pressed into layer of encapsulant 42 such that the plate or screen overlies upper surface 48 of layer of encapsulant 42.

Figure 13A:
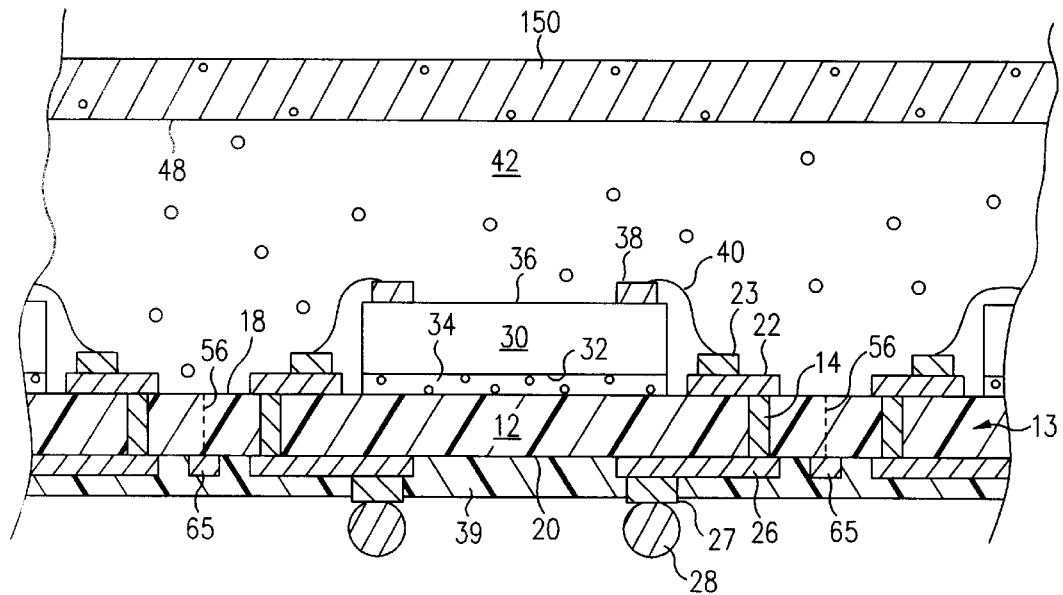
FIGS. 13A and 13B are cross-sectional and bottom plan views, respectively, of the shielded package further along in fabrication in accordance with the present invention.
Figure 13B:
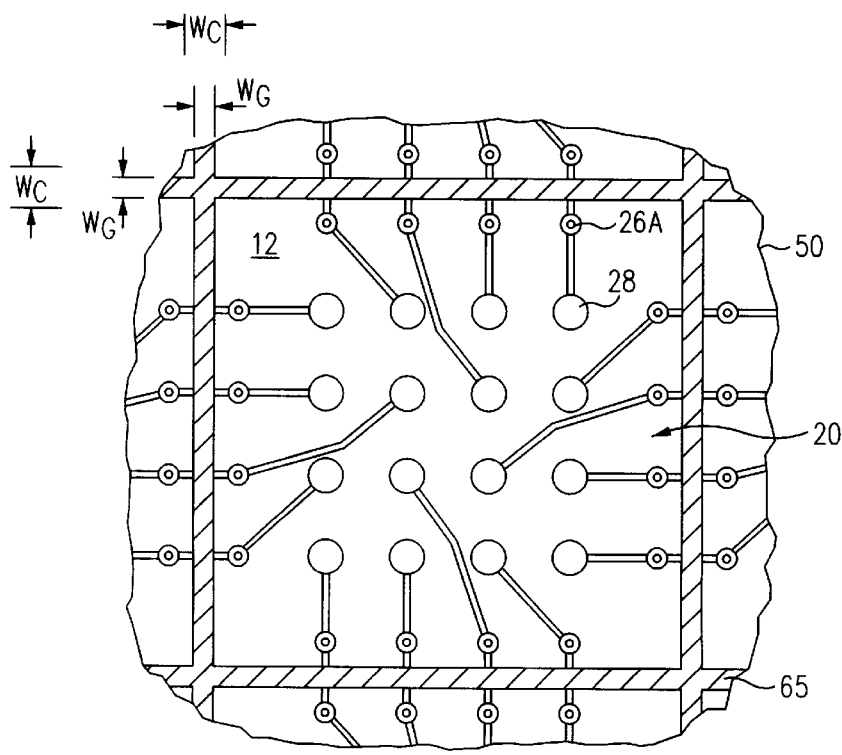

FIGS. 13A and 13B are cross-sectional and bottom plan views, respectively, of shielded package 10B further along in processing. In FIG. 13B, solder mask 39 is not shown for purposes of clarity. As shown in FIG. 13A, interconnection balls 28, typically eutectic solder balls, preferably made of 63% tin and 37% lead, are attached to contacts 27 using conventional techniques.

As shown in FIG. 13B, interconnection balls 28 are arranged in an array thus forming a ball grid array. Although the formation of a package including interconnection balls 28 is described, in alternative embodiments, contacts 27 form interconnection pads for electrical interconnection with other components and interconnection balls 28 are not formed. Further, the interconnection balls or pads can be arranged adjacent the perimeter of section 12, i.e. can be arranged near reference grid 65 (near lines 56 and/or lines 58), instead of being arranged in an array fashion as in FIG. 13B.

In an alternative embodiment, the interconnection balls or the interconnection pads are formed at substrate bonding locations on second surface 20 of substrate 12. As described in reference to FIG. 1, the interconnection balls or interconnection pads formed at the substrate bonding locations are electrically coupled to metallizations 22 by electrically conductive traces and/or vias of substrate 12. Thus, in this alternative embodiment, metallizations 26 may not be present on second surface 20 of substrate 12, for example when the substrate bonding locations are at the end of electrically conductive vias.

Referring again to FIG. 13A, substrate 13, layer of encapsulant 42 and shield layer 150 are then cut, typically by sawing, along lines 56, 58 (best seen in FIG. 7A) to form shielded package 10B (FIG. 3). Typically, solder mask 39 (or second surface 20 of substrate 13) is marked for cutting. A blue wafer mounting tape (available from Nitto for example) conventionally used to hold a wafer while it is cut into individual IC chips can be used to hold the assembly while substrate 13, layer of encapsulant 42 and shield layer 150 are cut to form shielded package 10B as those skilled in the art will understand.

Of importance, the width $W_C$ of the cut is greater than the width $W_G$ of reference grid 65. Thus, during the process of cutting substrate 13, layer of encapsulant 42 and shield layer 150, reference grid 65 is sawed away leaving each metallization 26 electrically isolated from all the other metallizations 26. This, in turn, results in a structure where each interconnection ball 28 is electrically coupled to only a single corresponding bonding pad 38.

Cutting substrate 13 simultaneously with layer of encapsulant 42 and shield layer 150 forms package 10B with edges 43 of layer of encapsulant 42 and edges 152 of shield layer 150 (see FIG. 3) coincident with edges 46 of substrate 12. It is understood that in this embodiment, substrate 12 (FIG. 3) in each shielded package 10B is a section of the larger substrate 13 (FIG. 7A).

After substrate 13, layer of encapsulant 42 and shield layer 150 are cut, yet while the individual packages 10B are still mounted on the blue wafer mounting tape, each shielded package 10B is tested and bad packages are marked. (Substrate 13 is mounted onto the blue wafer mounting tape with shield layer 150 facing down onto the blue wafer mounting tape and interconnection balls 28 facing up.) Testing involves contacting interconnection balls 28 (which are conveniently facing upwards) with test probes or contacts as is known to those skilled in the art. Testing the plurality of packages together while the packages are still mounted on the blue wafer mounting tape is faster and advantageously reduces testing cost as compared to placing each package into a tester individually and then testing the package.

For simplicity only a few bonding pads 38 are illustrated on IC chip 30 in the above figures. However, it is understood that typically a large number of bonding pads 38 with corresponding leads, i.e. with corresponding electrically conductive pathways formed by bond wires 40, contacts 23, metallizations 22, conductive through-holes 14, metallizations 26, contacts 27 and interconnection balls 28, are formed depending upon the particular input/output (I/O) requirements of the device. Generally, the number of bonding pads 38 with corresponding leads is less than 300 and typically is less than 64.

Referring again to FIG. 7A, fabricating a plurality of packages simultaneously, in contrast to individually, from a single substrate 13 advantageously reduces handling costs thereby reducing the cost of fabricating each individual package. Further, by fabricating a plurality of packages simultaneously from a single substrate 13, waste or trimming of substrate 13 is reduced or essentially eliminated thereby further reducing the cost of fabricating each individual package. (In contrast, when individual integrated circuit packages are fabricated, the substrate is slightly oversized to allow handling of the substrate, and the excess substrate is trimmed in subsequent fabrication steps.)

The cost of fabricating each individual package can be further reduced by properly sizing substrate 13.

In particular, by using a rectangular substrate 13 which is sized to correspond with the number of packages being fabricated, waste of substrate 13 is minimized or essentially eliminated. For example, if IC chip 30 has an area equal to 0.04 in$^2$ (200 mil×200 mil) and dimension A (FIG. 3) is 25 mil, then substrate 13 should have lateral and vertical dimensions equal to multiples of 250 mil depending upon the number of packages to be formed from substrate 13 (200 mil for each IC chip 30 plus 2×25 mil or 50 mil for dimension A on both sides of each IC chip 30). Thus, in this example, for a 2"×2" substrate 13, 64 packages can be formed simultaneously. However, it is understood that substrates with other dimensions and shapes can be used, for example a circular substrate can be used. Further, it is understood that the number of packages fabricated per substrate and the amount of substrate waste or trimmings generate from a substrate are determined by the substrate size, the size of the IC chip and the dimension A.

In another embodiment, the size of shielded package 10B (FIG. 3) is determined by the leadcount, i.e. by the number of interconnection balls 28 which must be formed. For this embodiment, relevant parameters for a given interconnection ball diameter are presented in Table 1.

TABLE 1

| Ball diameter (inches) | Minimum substrate edge to ball distance (inches) | Minimum Ball Pitch (mm) | Minimum Ball Height (inches) |
| --- | --- | --- | --- |
| 0.012 | 0.015 | 0.50 | 0.007 |
| 0.015 | 0.017 | 0.50 | 0.010 |
| 0.020 | 0.019 | 0.75 | 0.013 |
| 0.025 | 0.020 | 1.00 | 0.015 |
| 0.030 | 0.023 | 1.27 | 0.019 |

In Table 1, minimum substrate edge to ball distance refers to the minimum distance between any interconnection balls 28 (FIG. 3) and edge 46 of substrate 12. Minimum ball pitch is the minimum spacing between interconnection balls. Thus, for a given number of interconnection balls having a given ball diameter, the size of substrate 12 needed to accommodate the interconnection balls can be readily calculated by knowing the minimum ball pitch and minimum substrate edge to ball distance as provided in Table 1.

The minimum ball height in Table 1 refers to the additional thickness added by interconnection balls 28 to dimensions B, C (FIG. 3) after interconnection balls 28 have been reflowed (interconnection balls 28 are reflowed to interconnect shielded package 10B to other electrical components such as to a printed circuit board).

FIGS. 14, 15, 16, 17 and 18 are top plan views of various features of a substrate in accordance with this embodiment of the present invention.

Figure 14:
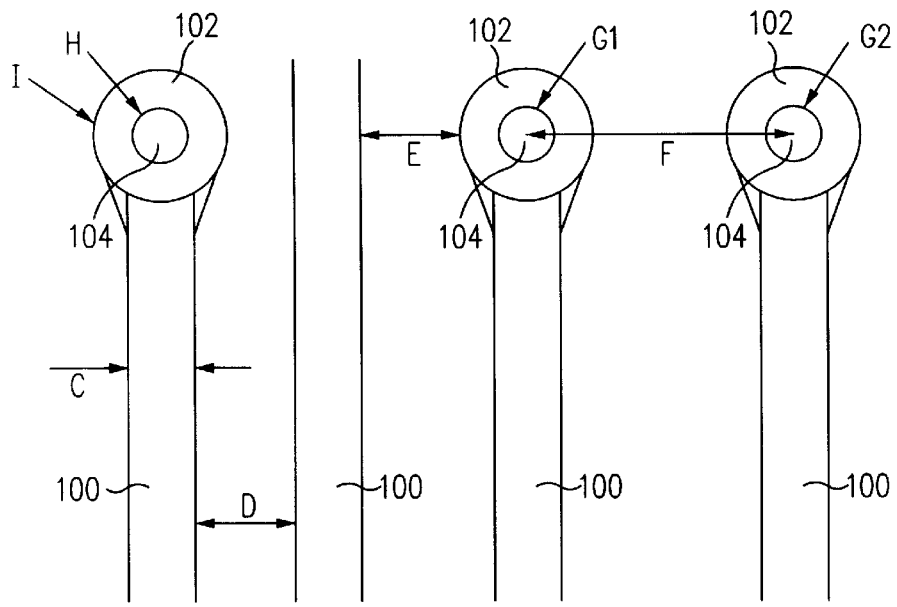
FIGS. 14, 15, 16, 17 and 18 are top plan views of various features of a substrate in accordance with another embodiment of the present invention.

FIG. 14 illustrates conductive lines 100 and via lands 102 including vias 104. In this embodiment, the minimum width C of lines 100 is 0.003 in. The minimum spacing D between lines 100 is 0.004 in. The minimum spacing E between a line 100 and a via land 102 is 0.0035 in. The minimum via center to via center spacing F is 0.5 G1 plus 0.5 G2 plus 0.010 in. ((½) G1+(½)G2+0.010 in.) where G1 and G2 are the diameters of the adjacent vias 104. The minimum diameter H of any via 104 is 0.010 in. for substrates less than 0.024 in. thick and 0.012 in. for substrates thicker than 0.024 in. The minimum diameter I of any via land 102 is diameter H of via 104 plus 0.006 in. (H+0.006 in.).

Figure 15:
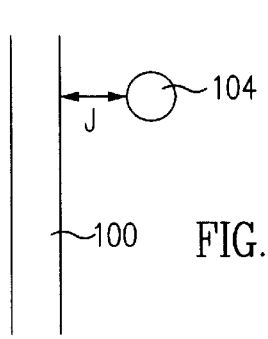

FIG. 15 illustrates the minimum spacing J between a line 100 on an internal layer of a multi-layered substrate and a via 104 passing through the internal layer in accordance with this embodiment of the invention. The minimum spacing J is 0.0035 in.

Figure 16:
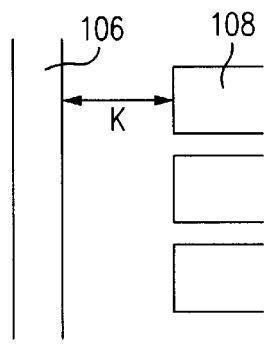

FIG. 16 illustrates the minimum spacing K between a metallization 106 covered by a solder mask (not shown) and a metallization 108 not covered by a solder mask. The minimum spacing K is 0.007 in. Note that the minimum spacing K is greater than the minimum spacing D between lines 100 (FIG. 14) since the minimum spacing K must include tolerances associated with the placement of the solder mask.

Figure 17:
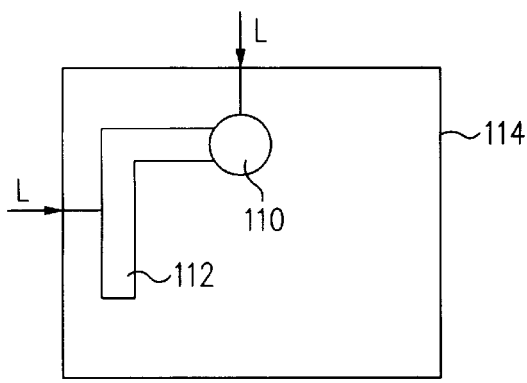

FIG. 17 illustrates the minimum spacing L between any via 110, metallization or other feature 112 and any edge 114 of the substrate. Edge 114 refers to the edge of a substrate from which a plurality of CHIPARRAY™ packages are fabricated. (For example, one of the four edges of substrate 13 in FIG. 7A, i.e. one of the edges of substrate 13 adjacent dam 59.) The minimum spacing L is 0.008 in.

Figure 18:
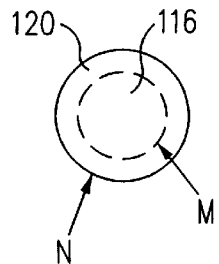

FIG. 18 illustrates the minimum diameter M of a solder mask defined opening 116 and the minimum diameter N of a contact 120 upon which an interconnection ball will be formed for a solder mask defined contact. The minimum diameter M is 0.006 in. The minimum diameter N is greater than the minimum diameter M. However, in an alternative embodiment, non-solder mask defined contacts are used. In this alternative embodiment, 116 is the contact, 120 is the solder mask defined opening, diameter M is the minimum diameter of the contact 116 and diameter N is the minimum diameter of the solder mask defined opening 120. In either embodiment, the interconnection ball formed on the contact will be confined to the diameter M.

FIGS. 19 and 20 are cross-sectional view of fully shielded package 10D at various stages during fabrication in accordance with an alternative embodiment of the present invention. Referring to FIG. 19, after IC chips 30 are mounted to substrate 13A and wirebonded, encapsulant caps 208 are formed. Illustratively, encapsulant caps 208 are formed by applying a medium viscosity encapsulant using a conventional needle dispenser and then curing the encapsulant. In one embodiment, the medium viscosity encapsulant is Hysol 4323 or 4322 or an equivalent.

The medium viscosity encapsulant has sufficient viscosity to flow around and encapsulate IC chip 30 including bonding pads 38, bond wires 40, metallizations 22 and contacts 23. However, the encapsulant has a high enough viscosity to prevent the encapsulant from significantly flowing away from the point of application. Accordingly, the encapsulant is confined to the region inward of ground contacts 202.

Referring now to FIG. 20, after encapsulant caps 208 are applied and cured, an electrically conductive liquid encapsulant is applied and cured to form shield layer 210. Shield layer 210 is formed in a manner similar to the formation of layer of encapsulant 42 and shielded layer 150 described in relation to FIGS. 11 and 12, i.e. by filling a pocket defined by dam 59 with an encapsulant (except that a single electrically conductive liquid encapsulant is used). Shield layer 210 encapsulates encapsulant caps 208, the portion of first surface 18 of substrate 13A uncovered by encapsulant caps 208, and grounding contacts 202. In one embodiment, ground plane 200 and thus shield layer 210 are electrically connected to ground, e.g., through electrical interconnections with reference grid 65 and/or interconnection balls 28G. Processing then continues as described in relation to FIGS. 8–13 to form fully shielded package 10D (FIG. 5).

Of importance, a plurality of fully shielded packages 10D are formed using only a three step encapsulation process, i.e. (1) forming a single dam 59; (2) forming encapsulant caps 208; and (3) forming shield layer 210. In contrast, Lin requires a four step encapsulation process for each package, i.e. (1) forming dam structure 40; (2) applying first encapsulant 38; (3) forming dam structure 44; and (4) applying second encapsulant 42. Accordingly, formation of fully shielded packages 10D in accordance with the present invention is relatively simple, is less labor intensive and, consequently, is substantially less expensive than Lin.

Although the present invention has been described with reference to preferred embodiments, persons skilled in the art will recognize that changes may be made in form and detail without departing from the spirit and scope of the invention. For example, referring to FIG. 1, contacts 23 and/or contacts 27 are optional and do not have to be formed. Further, a solder mask layer can be formed over selective portions of first surface 18 of substrate 12. Also, solder mask layer 39 on second surface 20 of substrate 12 does not have to be formed. Further, referring to FIG. 7B, instead of using dam 59 and liquid encapsulants, conventional transfer molding processes can be used to encapsulate the assembly. Thus, the invention is limited only by the following claims.

What is claimed is:

1. A method of forming a plurality of electronic device packages from an insulating substrate, said method comprising the steps of:

providing said insulating substrate which has sections;

mounting an electronic device in each of said sections;

encapsulating said electronic devices and a first surface of said insulating substrate with an insulating encapsulant layer;

applying a conductive shield layer above said encapsulant layer; and cutting said encapsulant layer, said shield layer forming a dam on said first surface of said insulating substrate around a perimeter of said insulating substrate wherein said step of encapsulating comprises partially filling a pocket defined by said dam with encapsulant; and said insulating substrate along a periphery of each of said sections to form said plurality of electronic device packages.

2. The method of claim 1 further comprising the step of embedding heat slugs into said encapsulant layer over each of said sections.

3. The method of claim 1 wherein said step of forming a dam comprises the step of applying encapsulant around said perimeter of said insulating substrate.

4. The method of claim 3 wherein said step of applying encapsulant is performed with a needle dispenser.

5. The method of claim 1 wherein said step of applying a conductive shield layer comprises further filling said pocket with a flowable electrically conductive material.

6. The method of claim 1 wherein said electronic devices have first surfaces with bonding pads thereon and said first surface of said insulating substrate has metallizations thereon, second surfaces of said electronic devices being attached to said first surface of said insulating substrate, said method further comprising the step of wirebonding said bonding pads to corresponding ones of said metallizations with bond wires, wherein said step of encapsulating further comprises encapsulating said bonding pads, said bond wires and said metallizations in said insulating encapsulant layer.

7. The method of claim 1 wherein said electronic devices are mounted in each of said sections by flip-chip interconnections.

8. The method of claim 1 wherein said step of providing further comprises providing metallizations on said first surface of said insulating substrate, said metallizations being electrically connected to one another, and wherein said electronic devices have first surfaces with bonding pads thereon, said method further comprising the steps of:

electrically connecting said bonding pads to corresponding ones of said metallizations; and electrically connecting said metallizations to an external reference voltage.

9. The method of claim 8 wherein said cutting step electrically disconnects said metallizations from one another.

10. The method of claim 1 wherein said encapsulant layer comprises an electrically insulating thermally conductive filler.

11. A method of forming a plurality of electronic device packages from an insulating substrate, said method comprising the steps of:

providing said insulating substrate, said insulating substrate having sections and an internal ground plane, each of said sections having at least one ground contact, each of said sections comprising a first portion inward of said at least one ground contact and a second portion on which said at least one ground contact is located, each of said at least one ground contact being electrically connected to said internal ground plane;

mounting an electronic device in each of said first portions;

enclosing said electronic devices and said first portions in insulating caps;

enclosing said insulating caps, said second portions and said ground contacts in a conductive shield layer; forming a dam on said first surface of said insulating substrate around a perimeter of said insulating substrate wherein said step of enclosing said insulating caps, said second portion and said ground contacts in a conductive shield layer comprises filling a pocket defined by said dam with a flowable electrically conductive material; and cutting said shield layer and said insulating substrate along a periphery of each of said sections to form said plurality of electronic device packages.

12. The method of claim 11 wherein said step of enclosing said electronic devices and said first portions in insulating caps further comprises the step of applying a medium viscosity encapsulant.

13. The method of claim 12 wherein said step of applying a medium viscosity encapsulant is performed with a needle dispenser.

14. The method of claim 12 wherein said step of applying a medium viscosity encapsulant comprises applying said medium viscosity encapsulant to said first portions of said sections, said medium viscosity encapsulant having a viscosity sufficient to prevent said medium viscosity encapsulant from flowing from said first portions to said second portions of said sections.

15. The method of claim 12 wherein said step of applying a medium viscosity encapsulant comprises applying said medium viscosity encapsulant to said first portions of said sections, said medium viscosity encapsulant having a viscosity sufficient to confine said medium viscosity encapsulant to said first portions of said sections.

16. The method of claim 1 wherein said step of providing further comprises providing metallizations on said first surface of said insulating substrate, said metallizations being electrically connected to one another, and wherein said electronic devices have first surfaces with bonding pad thereon, said method further comprising the steps of:

electrically connected said bonding pads to corresponding ones of said metallizations; and electrically connecting said metallizations to an external reference voltage.

17. The method of claim 16 wherein said cutting step electrically disconnects said metallizations from one another.

* * * * *

UNITED STATES PATENT AND TRADEMARK OFFICE
CERTIFICATE OF CORRECTION

PATENT NO. : 6,150,193
DATED : November 21, 2000
INVENTOR(S) : Thomas P. Glenn

Page 1 of 1

It is certified that error appears in the above-identified patent and that said Letters Patent is hereby corrected as shown below:

Column 14,
Line 44, cancel beginning with "1. A method of" to and including "packages."
Line 61, and insert the following claim:

1. A method of forming a plurality of electronic device packages from an insulating substrate, said method comprising the steps of:
providing said insulating substrate which has sections;
mounting an electronic device in each of said sections;
encapsulating said electronic devices and a first surface of said insulating substrate with an insulating encapsulant layer;
applying a conductive shield layer above said encapsulant layer; forming a dam on said first surface of said insulating substrate around a perimeter of said insulating substrate wherein said step of encapsulant comprises partially filling a pocket defined by said dam with encapsulant; and
cutting said encapsulant layer, said shield layer and said insulating substrate along a periphery of each of said sections to form said plurality of electronic device packages.

Signed and Sealed this

Eighteenth Day of September, 2001

*Attest:*

NICHOLAS P. GODICI
*Attesting Officer*    *Acting Director of the United States Patent and Trademark Office*